(12) United States Patent
Co et al.

(10) Patent No.: US 7,487,428 B2
(45) Date of Patent: Feb. 3, 2009

(54) FULLY-BUFFERED MEMORY-MODULE WITH ERROR-CORRECTION CODE (ECC) CONTROLLER IN SERIALIZING ADVANCED-MEMORY BUFFER (AMB) THAT IS TRANSPARENT TO MOTHERBOARD MEMORY CONTROLLER

(75) Inventors: Ramon S. Co, Trabuco Canyon, CA (US); David Sun, Irvine, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 417 days.

(21) Appl. No.: 11/309,298

(22) Filed: Jul. 24, 2006

(65) Prior Publication Data

US 2008/0022186 A1      Jan. 24, 2008

(51) Int. Cl.
*G11C 29/00* (2006.01)
(52) U.S. Cl. ...................................... 714/763
(58) Field of Classification Search ................... 714/763
See application file for complete search history.

(56) References Cited

U.S. PATENT DOCUMENTS

| | | | | |
|---|---|---|---|---|
| 5,612,964 | A * | 3/1997 | Haraszti | 714/763 |
| 6,345,374 | B1 * | 2/2002 | Tsuda | 714/746 |
| 7,007,130 | B1 | 2/2006 | Holman | 711/5 |
| 7,010,642 | B2 | 3/2006 | Perego et al. | 711/5 |
| 7,020,825 | B2 * | 3/2006 | Watanabe et al. | 714/763 |
| 7,032,158 | B2 | 4/2006 | Alvarez, II et al. | 714/763 |
| 2005/0246594 | A1 | 11/2005 | Co et al. | 714/52 |
| 2006/0020740 | A1 | 1/2006 | Bartley et al. | 711/100 |
| 2006/0047899 | A1 | 3/2006 | Ilda et al. | 711/113 |
| 2006/0075282 | A1 | 4/2006 | Borkenhagen et al. | 714/5 |
| 2006/0090112 | A1 | 4/2006 | Cochran et al. | 714/737 |
| 2006/0095592 | A1 | 5/2006 | Borkenhagen | 710/2 |

* cited by examiner

*Primary Examiner*—Guy J Lamarre
(74) *Attorney, Agent, or Firm*—Stuart T. Auvinen; g Patent LLC

(57) ABSTRACT

An error-correcting fully-buffered memory module can detect and correct some errors in data read from memory chips. An error correction code ECC controller is added to the Advanced Memory Buffer (AMB) on the memory module that fully buffers memory requests sent as serial packets. The error correction controller generates ECC bits for write data, and both the ECC bits and the write data are written to the memory chips by a DRAM controller in the AMB. During reads, an ECC checker generates a syndrome and can activate an error corrector to correct data or signal a non-correctable error. The corrected data is formed into serial packets sent back to the motherboard by the AMB. Configuration data for the ECC controller could be first programmed into a serial-presence-detect electrically-erasable programmable read-only memory (SPD-EEPROM) on the memory module, and then copied to error-correction configuration registers on the AMB during power-up.

22 Claims, 8 Drawing Sheets

FRONT SIDE

FULLY-BUFFERED MEMORY-MODULE WITH ERROR-CORRECTION CODE (ECC) CONTROLLER IN SERIALIZING ADVANCED-MEMORY BUFFER (AMB) THAT IS TRANSPARENT TO MOTHERBOARD MEMORY CONTROLLER

FIELD OF THE INVENTION

This invention relates to memory modules, and more particularly to memory modules with error-correction code (ECC).

BACKGROUND OF THE INVENTION

Servers, personal computers (PC's), and other electronic systems often use small printed-circuit board (PCB) daughter cards known as memory modules instead of directly mounting individual memory chips on a motherboard. The memory modules are built to meet specifications set by industry standards, thus ensuring a wide potential market. High-volume production and competition have driven module costs down dramatically, benefiting the PC buyer.

Memory modules are made in many different sizes and capacities, such as older 30-pin and 72-pin single-inline memory modules (SIMMs) and newer 168-pin, 184-pin, and 240-pin dual inline memory modules (DIMMs). The "pins" were originally pins extending from the module's edge, but now most modules are leadless, having metal contact pads or leads. The modules are small in size, being about 3-5 inches long and about an inch to an inch and a half in height.

The modules contain a small printed-circuit board substrate, typically a multi-layer board with alternating laminated layers of fiberglass insulation and foil or metal interconnect layers. Surface mounted components such as DRAM chips and capacitors are soldered onto one or both surfaces of the substrate.

FIG. 1 shows a fully-buffered memory module. Memory module 10 contains a substrate such as a multi-layer printed-circuit board (PCB) with surface-mounted DRAM chips 22 mounted to the front surface or side of the substrate, as shown in FIG. 1, while more DRAM chips 22 are mounted to the back side or surface of the substrate (not shown). Memory module 10 is a fully-buffered dual-inline memory module (FB-DIMM) that is fully buffered by Advanced Memory Buffer (AMB) 24 on memory module 10.

Metal contact pads 12 are positioned along the bottom edge of the module on both front and back surfaces. Metal contact pads 12 mate with pads on a module socket to electrically connect the module to a PC's motherboard. Holes 16 are present on some kinds of modules to ensure that the module is correctly positioned in the socket. Notches 14 also ensure correct insertion of the module. Capacitors or other discrete components are surface-mounted on the substrate to filter noise from the DRAM chips 22.

As system clock speeds increase, data must be transmitted and received at ever-increasing rates. Differential signaling techniques are being used to carry data, clock, and commands to and from memory modules. AMB 24 is a chip mounted onto the substrate of memory module 10 to support differential signaling through metal contact pads 12. AMB 24 sends and receives external packets or frames of data and commands to other memory modules in other sockets over differential data lines in metal contact pads 12.

AMB 24 also extracts data from the external frames and writes the extracted data to DRAM chips 22 on memory module 10. Command frames to read data are decoded by AMB 24. AMB 24 sends addresses and read signals to DRAM chips 22 to read the requested data, and packages the data into external frames that are transmitted from AMB 24 over metal contact pads 12 to other memory modules and eventually to the host processor.

Memory module 10 is known as a fully-buffered memory module since AMB 24 buffers data from DRAM chips 22 to metal contact pads 12. DRAM chips 22 do not send and receive data directly from metal contact pads 12 as in many prior memory module standards. Since DRAM chips 22 do not directly communicate data with metal contact pads 12, signals on metal contact pads 12 can operate at very high data rates.

FIG. 2 shows detail of an advanced memory buffer on a fully-buffered memory module. AMB 24 contains DRAM controller 50, which generates DRAM control signals to read and write data to and from DRAM chips 22 on memory module 10. Data is temporarily stored in FIFO 58 during transfers.

The data from FIFO 58 is encapsulated in frames that are sent over differential lines in metal contact pads 12. Rather than being sent directly to the host central processing unit (CPU), the frames are passed from one memory module to the next memory module until the frame reaches the host CPU. Differential data lines in the direction toward the host CPU are known as northbound lanes, while differential data lines from the CPU toward the memory modules are known as southbound lanes.

When a frame is sent from the host CPU toward a memory module, the frame is sent over the southbound lanes toward one of the memory modules in the daisy chain. Each memory module passes the frame along to the next memory module in the daisy chain. Southbound lanes that are input to a memory module are buffered by its AMB 24 using re-timing and re-synchronizing buffers 54. Re-timing and re-synchronizing buffers 54 restore the timing of the differential signals prior to retransmission. Input buffers 52 and output buffers 56 contain differential receivers and transmitters for the southbound lanes that are buffered by re-timing and re-synchronizing buffers 54.

Frames that are destined for the current memory module are copied into FIFO 58 and processed by AMB 24. For example, for a write frame, the data from FIFO 58 is written to DRAM chips 22 on the memory module by AMB 24. For a read, the data read from DRAM chips 22 is stored in FIFO 58. AMB 24 forms a frame and sends the frame to northbound re-timing and re-synchronizing buffers 64 and out over the northbound lanes from differential output buffer 62. Input buffers 66 and output buffers 62 contain differential receivers and transmitters for the northbound lanes that are buffered by re-timing and re-synchronizing buffers 64.

Self-testing of the memory module is supported by built-in self-test (BIST) controller 60. BIST controller 60 may support a variety of self-test features such as a mode to test DRAM chips 22 on the module and a loop-back test mode to test connections through metal contact pads 12 on memory module 10.

FIG. 3 shows fully-buffered memory modules daisy chained together. Host CPU 210 on motherboard 28 reads and writes main memory in DRAM chips 22 on memory modules 201-204 through memory controller 220 on motherboard 28. Memory modules 201-204 are inserted into memory module sockets on motherboard 28.

Rather than read and write DRAM chips 22 directly, host CPU 210 sends read and write commands in packets or frames that are sent over southbound lanes 102. The frame from host CPU 210 is first sent from memory controller 220 to first memory module 201 in the first socket. AMB 24 on first memory module 201 examines the frame to see if it is intended for first memory module 201 and re-buffers and passes the frame on to second memory module 202 over another segment of southbound lanes 102. AMB 24 on second memory module 202 examines the frame and passes the frame on to third memory module 203. AMB 24 on third memory module 203 examines the frame and passes the frame on to fourth memory module 204.

When data is read, or a reply frame is sent back to host CPU 210, northbound lanes 104 are used. For example, when DRAM chips 22 on third memory module 203 are read, the read data is packaged in a frame by AMB 24 and sent over northbound lanes 104 to second memory module 202, which re-buffers the frame and sends it over another segment of northbound lanes 104 to first memory module 201. First memory module 201 then re-buffers the frame of data and sends it over northbound lanes 104 to memory controller 220 and on to host CPU 210.

Since northbound lanes 104 and southbound lanes 102 are composed of many point-to-point links between adjacent memory modules, the length and loading of these segments is reduced, allowing for higher speed signaling. Signaling is to AMB 24 on each memory module rather than to DRAM chips 22.

Memory modules may also support error detection and correction. A parity bit may be added to each data byte to detect errors. Some early memory modules were 9 bits wide to support parity bits, allowing detection of memory errors. The memory controller on the motherboard had additional circuitry to generate parity bits on write and check parity on reads.

Correctable memory is desirable for certain applications, such as server memory for various business-critical systems. Additional bits, known as error-correction code (ECC) bits may be attached to each data word. The width of memory modules may be expanded to allow for ECC bits. For example, a memory module may be 72 bits wide, to allow for 64 data bits and 8 ECC bits.

The memory controller on the motherboard must support ECC by generating the ECC bits for each write, and reading the data and ECC bits and generating syndromes or other checks on reads. However, many motherboards do not have memory controllers that support ECC; thus error correction may not be supported, especially in older legacy systems.

What is desired is to add error correction capabilities to older legacy motherboards that do not have a memory controller that supports error correction. A memory module that contains ECC circuitry that is transparent to the motherboard's memory controller is desirable. It is further desired to add error correction capabilities to fully-buffered memory modules. A fully-buffered memory module with an Advanced Memory Buffer (AMB) that includes an ECC controller is desirable.

DETAILED DESCRIPTION

The present invention relates to an improvement in memory modules. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that an error-correction code (ECC) controller may be integrated with the Advanced Memory Buffer (AMB) of a fully-buffered memory module. This ECC controller on the AMB is transparent to the memory controller on the motherboard since the AMB receives serial packets from the motherboard. The AMB has a local DRAM controller that accesses DRAM chips on the memory module. The ECC controller can be integrated with the AMB chip to generate and check ECC as the local DRAM chips are accessed.

The ECC controller on the AMB allows the DRAM chips mounted onto the fully-buffered memory module to contain a few correctable defects. Manufacturing costs may be reduced since a limited pre-screen test of incoming memory chips may be performed, rather than a more exhaustive pre-screen test. Memory modules with a single-bit defect in one of its memory chips do not have to be reworked, eliminating the time-consuming de-soldering and soldering of the defective memory chip. In addition, infant mortalities may cause memory chips to pass the initial screen yet later fail.

Figure 3:
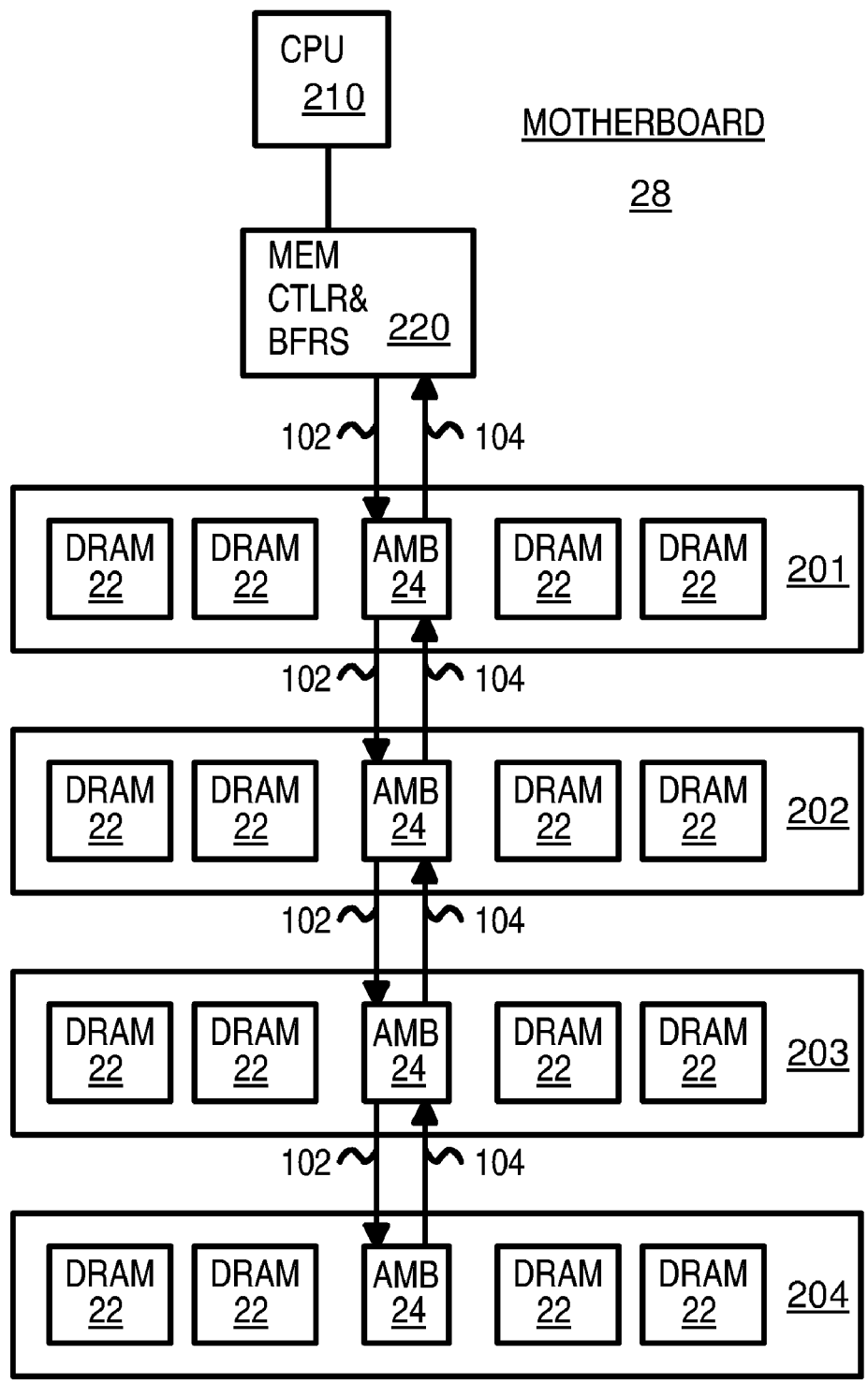
FIG. 3 shows fully-buffered memory modules daisy chained together.
Figure 4:
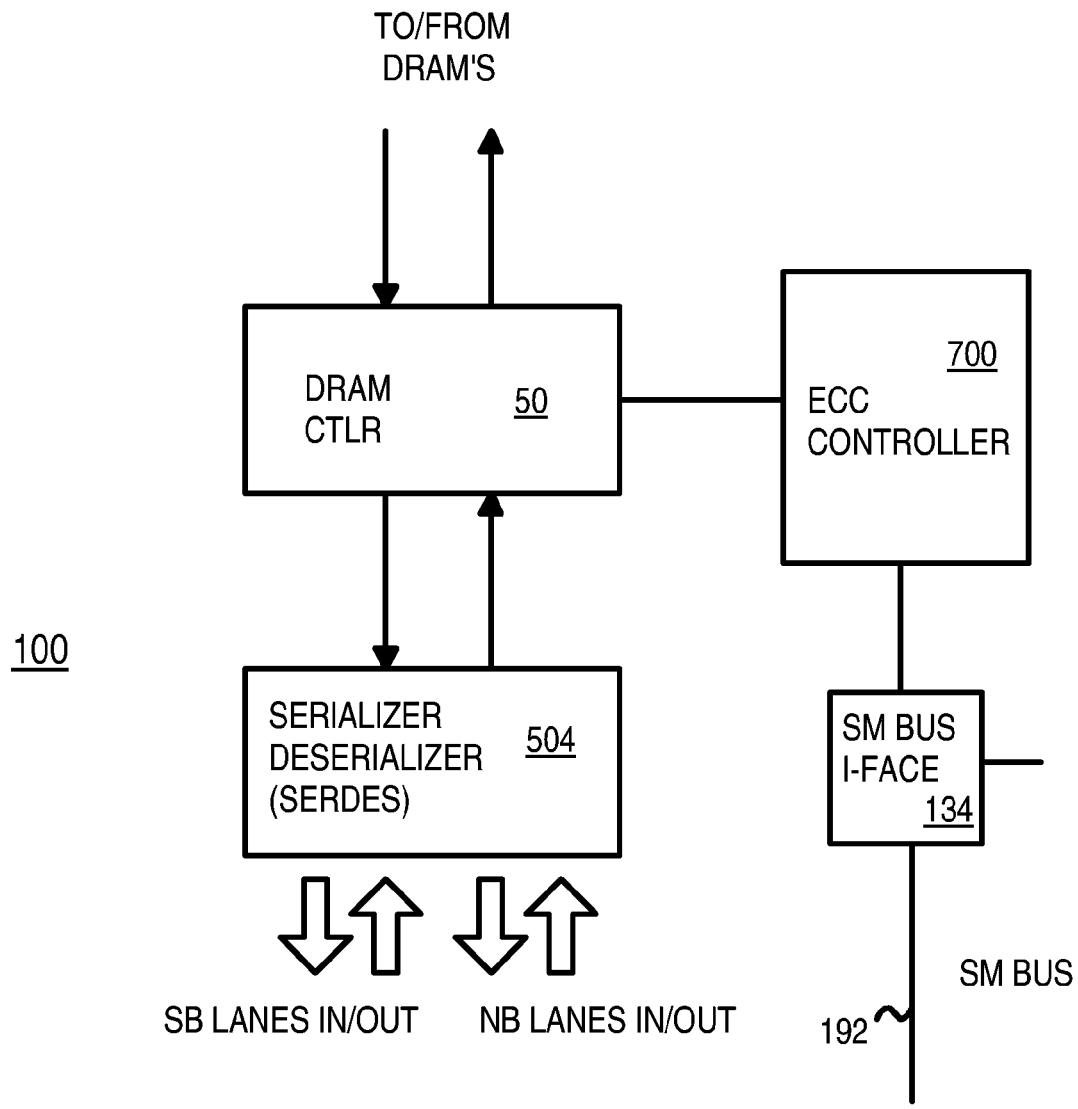
FIG. 4 shows some functional blocks inside an error-correcting AMB for an error-correcting fully-buffered memory module.

FIG. 4 shows some functional blocks inside an error-correcting AMB for an error-correcting fully-buffered memory module. Error-correcting AMB 100 replaces the standard AMB on memory module 10 of FIG. 1, or memory modules 201-204 of FIG. 3. No other changes are necessary for the memory modules in this embodiment, other than having a wider memory to allow room for the ECC bits. Thus error correction can be supported with a simple replacement of AMB 24 with error-correcting AMB 100.

Serial packets are received and retransmitted over southbound lanes for packets generated by the host. Serial packets are received and retransmitted over northbound lanes for packets generated by the memory modules. Serializer-deserializer 504 is an interface to the northbound and southbound lanes, and can examine serial packets and extract address, data, and commands from the packets. Serializer-deserializer 504 can also create serial packets for transmission back to the host, such as packets containing data read from local memory chips.

When serializer-deserializer 504 determines that an incoming packet is destined for the local memory module, the information in the packet is extracted and any address or data is converted from serial to a parallel format. The extracted address, command, and any data are sent to DRAM controller 50.

DRAM controller 50 generates local control signals such as RAS, CAS, WE and sends these signals to DRAM chips on the memory module. State machines may be used by DRAM controller 50 to generate these signals with appropriate pulse widths and timings to properly access the DRAM chips. Chip-select and byte-enable signals to the DRAM chips may be generated from the address as well as from these control signals. Data is applied to the DRAM chips for a write, or read from the DRAM chips being accessed for a read. The read data is then passed back to serializer-deserializer 504, converted to serial packets and transmitted back to the host over the northbound lanes.

When data is being written to the local memory chips by DRAM controller 50, ECC controller 700 is activated to generate the ECC bits for the data word being written. ECC bits can be generated by complex algorithms such as by using logic based on Reed-Solomon equations. Rather than keeping the data word unchanged and adding separate ECC bits, the data word itself could be replaced by a wider ECC word that encodes both the data and ECC information.

When data is being read from the local memory chips by DRAM controller 50, ECC controller 700 is activated to check for an error. The data and ECC bits read from the local memory chips are sent to ECC controller 700 by DRAM controller 50. ECC controller 700 checks for errors by performing mathematical operations on the data and ECC bits. For example, a Reed-Solomon syndrome could be generated from the combined data and ECC bits. When the syndrome's value is zero, no error was detected and the data can be passed on to Serializer-deserializer 504 for inclusion in serial packets to the motherboard. The ECC bits can be discarded by DRAM controller 50.

When the generated syndrome is non-zero, and error is detected. Error correction may be attempted by ECC controller 700. Various complex algorithms can be used to correct some errors, such as single-bit errors. Some multi-bit errors may also be correctable. When error correction is successful, the corrected data word is sent to DRAM controller 50 and on to Serializer-deserializer 504 for inclusion as data in serial packets sent to the motherboard.

When error correction fails, or is not possible, an error can be signaled to the motherboard. An error status line on the contact pads of the memory module could carry the error signal to an interrupt controller on the motherboard, or a serial packet could be generated to the memory controller on the motherboard indicating the error status.

ECC controller 700 may be configurable. For example, ECC controller 700 could support various widths of data and ECC bits. Different kinds of error-correction methods and equations may be supported. ECC controller 700 may have various timing options and error handling options. Programmable registers or configuration memory may be used to enable these various features of ECC controller 700. ECC controller 700 may be completely enabled and disabled using an enable configuration bit. These programmable registers may be programmed using commands in serial packets received from the motherboard by Serializer-deserializer 504.

Alternately, the configuration of ECC controller 700 may be programmed or written through SM-bus interface 134. SM-bus interface 134 receives serial commands from SM bus 192, which is a system management bus. ECC controller 700 may only have volatile configuration memory such as a register or static RAM that has to be loaded at each power-up. Alternately, ECC controller 700 could have non-volatile configuration memory such as electrically-erasable programmable read-only memory (EEPROM) or fuses that could be blown.

Figure 5:
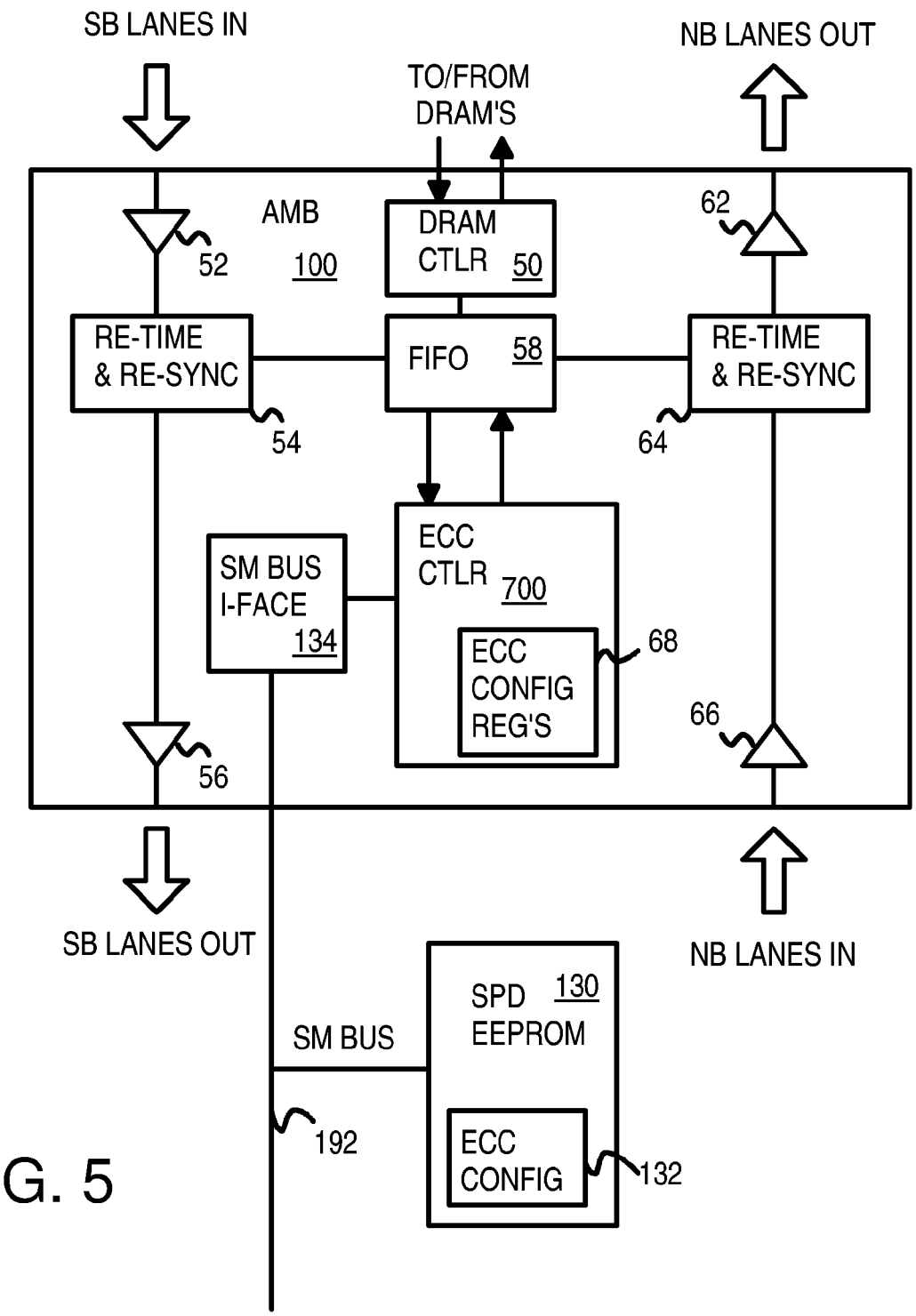
FIG. 5 shows an error-correcting AMB that has its configuration programmed from a serial-presence-detect electrically-erasable programmable read-only memory (SPD-EEPROM) on the memory module.

FIG. 5 shows an error-correcting AMB that has its configuration programmed from a serial-presence-detect electrically-erasable programmable read-only memory (SPD-EEPROM) on the memory module. Many memory modules contain SPD-EEPROM 130. SPD-EEPROM 130 stores configuration information for the memory module, such as speed, depth, and arrangement of the memory on the memory module. During initialization, the host processor reads the configuration from SPD-EEPROM 130 over SM bus 192 as serial data.

SPD-EEPROM 130 also stores ECC configuration for ECC controller 700 on the memory module. During manufacture, a desired ECC configuration is written as error-correction configuration 132 in SPD-EEPROM 130. Each time that the memory module is powered up or re-initialized, error-correction configuration 132 is transferred to error-correction configuration registers 68. SM-bus interface 134 reads error-correction configuration 132 from SPD-EEPROM 130 over SM bus 192.

Figure 1:
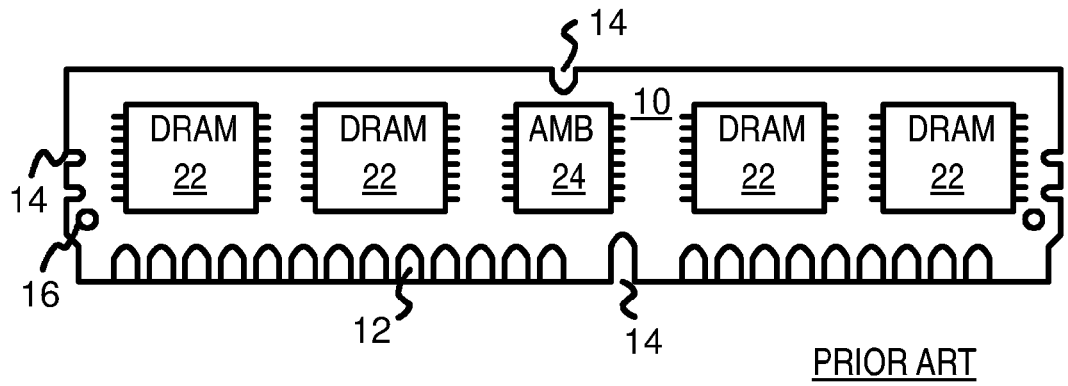
FIG. 1 shows a fully-buffered memory module.
Figure 2:
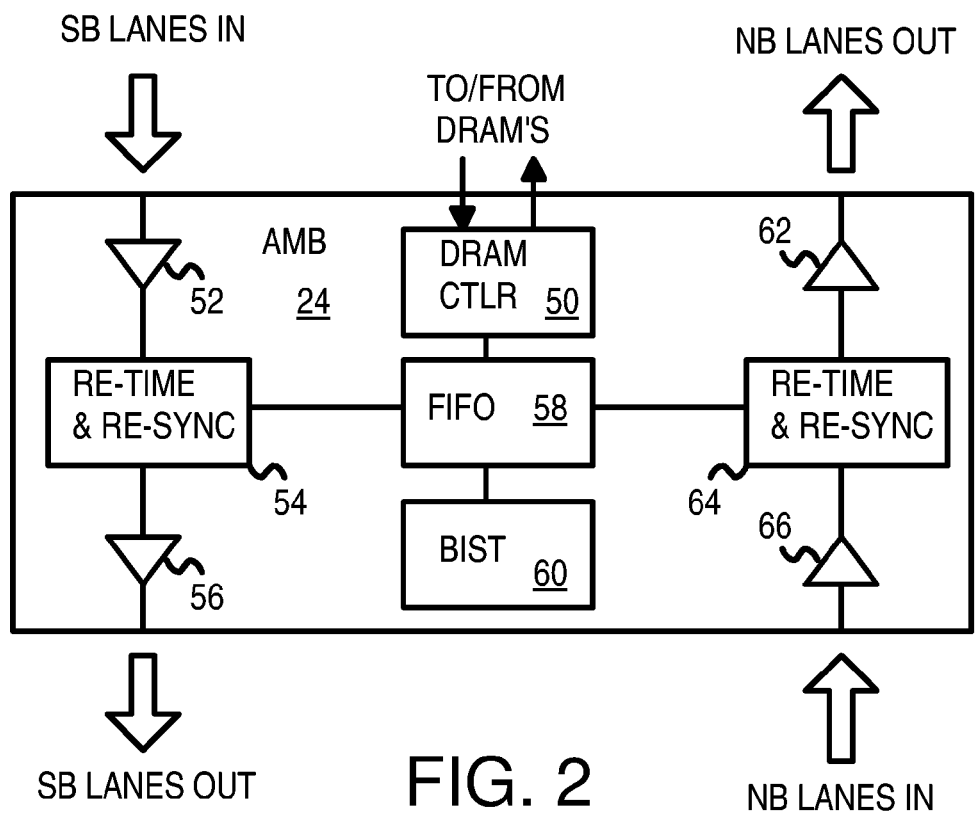
FIG. 2 shows detail of an advanced memory buffer on a fully-buffered memory module.

Error-correcting AMB 100 contains DRAM controller 50. DRAM controller 50 generates DRAM control signals to read and write data to and from DRAM chips 22 on memory module 10 (FIG. 1). Data is temporarily stored in FIFO 58 during transfers. The data from FIFO 58 is encapsulated in frames that are sent over differential lines in metal contact pads 12. Re-timing and re-synchronizing buffers 54 restore the timing of the differential signals received by input buffers 52 prior to retransmission. Input buffers 52 and output buffers 56 contain differential receivers and transmitters for the southbound lanes that are buffered by re-timing and re-synchronizing buffers 54.

Frames that are destined for the current memory module are copied into FIFO 58 and processed by error-correcting AMB 100. For example, for a write frame, the data from FIFO 58 is written to DRAM chips 22 on the memory module by error-correcting AMB 100. For a read, the data read from DRAM chips 22 is stored in FIFO 58. Error-correcting AMB 100 forms a frame and sends the frame to northbound re-timing and re-synchronizing buffers 64 and out over the northbound lanes from differential output buffer 62. Input buffers 66 and output buffers 62 contain differential receivers and transmitters for the northbound lanes that are buffered by re-timing and re-synchronizing buffers 64.

When ECC controller 700 is enabled, ECC controller 700 examines write-data in FIFO 58 before the data is written to the memory chips by DRAM controller 50. ECC controller 700 generates ECC bits for the write-data and writes these generated ECC bits to FIFO 58 or to another memory (not shown), or sends the ECC bits to DRAM controller 50 so the ECC bits can be written to the memory chips by DRAM controller 50.

When data is read from the memory chips by DRAM controller 50, the stored ECC bits are also read from the memory chips by DRAM controller 50. The read-data and the ECC bits are sent from DRAM controller 50 to ECC controller 700 so that ECC controller 700 can generate the syndrome and check for errors. Error correction may be attempted, and if successful, corrected data is written to FIFO 58 by ECC controller 700.

Alternately, DRAM controller 50 may write both the read-data and the ECC bits into FIFO 58. Then ECC controller 700 reads the read-data and the ECC bits from FIFO 58, and performs checking and correction. DRAM controller 50 and ECC controller 700 may be pipelined to operate on data at different times.

Figure 6:
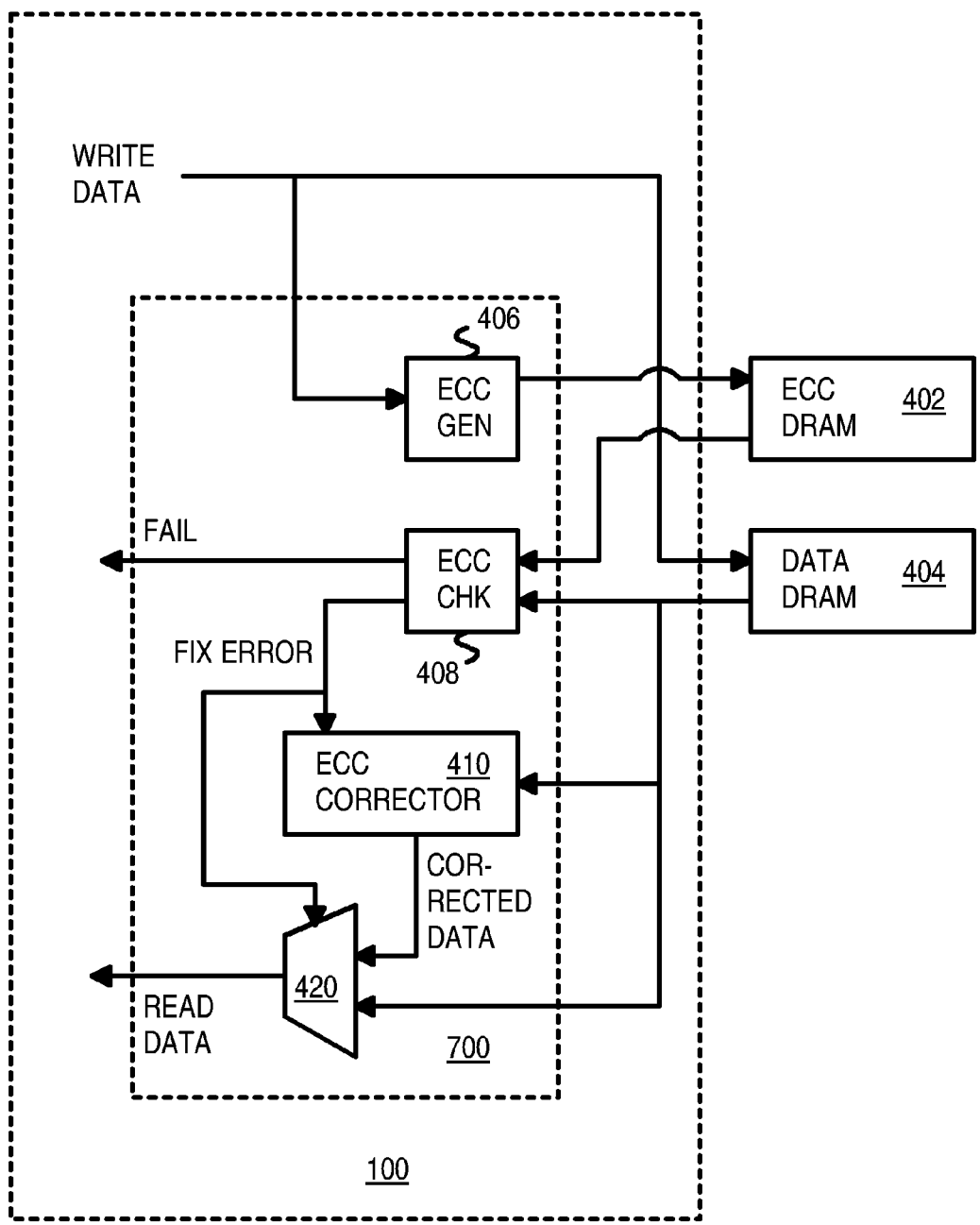
FIG. 6 is a schematic of an ECC controller within an error-correcting Advanced Memory Buffer (AMB).

FIG. 6 is a schematic of an ECC controller within an error-correcting Advanced Memory Buffer (AMB). Write-data are extracted from serial packets from the motherboard and are written into data DRAM 404, which are some of memory chips 22 (FIG. 8) on the memory module written by DRAM controller 50 (not shown). ECC controller 700 is a block within error-correcting AMB 100 on the memory module.

The incoming write-data is also applied to ECC generator 406, which generates the ECC bits for the write-data. A generator equation implemented in logic gates or in programmed hardware may be used for ECC generator 406. The generated ECC bits from ECC generator 406 are written into ECC DRAM 402, which include some of memory chips 22 (FIG. 8) on the memory module that are also written by DRAM controller 50 (not shown).

When DRAM controller 50 reads the memory chips, the read-data is read from data DRAM 404, while the ECC bits for that read-data are read from ECC DRAM 402. Both the read-data from data DRAM 404 and the ECC bits from ECC DRAM 402 are sent to ECC checker 408. ECC checker 408 generates a syndrome from the read-data and the ECC bits using a syndrome generator or similar logic. The value of the syndrome can indicate when an error occurred, and may include information about the error. For example, when the syndrome value is zero, no error was detected. When the syndrome is zero, the FIX_ERROR signal from ECC checker 408 is low, causing data mux 420 to pass the read-data from data DRAM 404 through to the serializer-deserializer, which packetizes the read-data and sends it to the motherboard.

Non-zero syndromes drive signal FIX_ERROR high to activate error corrector 410. Error corrector 410 may use the syndrome value to attempt to fix the error. Error corrector 410 may be a programmable processor that can execute fairly complex correction routines. When error corrector 410 is successful, the corrected read-data from error corrector 410 is sent through data mux 420. This corrected read-data is passed to the serializer-deserializer, which packetizes the read-data and sends it to the motherboard.

When error corrector 410 is unable to correct the error, a FAIL signal is activated. The FAIL signal can be sent to the motherboard in various ways, such as a status signal in a serial packet sent over the northbound lanes, or as an interrupt signal to an interrupt controller on the motherboard. The syndrome value from ECC checker 408 may indicate a non-correctable error so that error corrector 410 does not have to be activated. For example, syndrome values greater than 100 may indicate non-correctable errors.

Figure 7A:
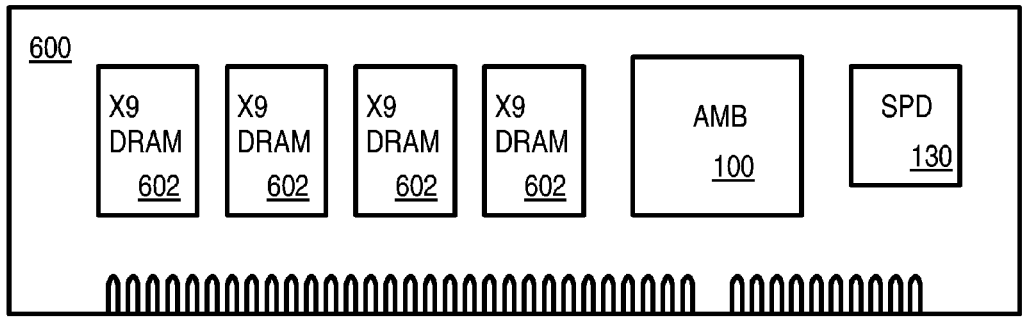
FIGS. 7A, 7B show arrangements of memory chips on memory modules having an error-correcting AMB.
Figure 7B:
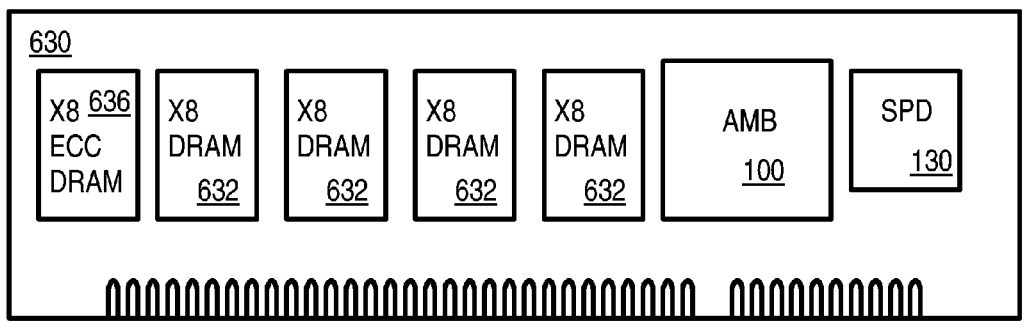

FIGS. 7A, 7B show arrangements of memory chips on memory modules having an error-correcting AMB. The memory chips mounted to the memory module store both data and ECC bits. Additional memory chips are needed for storing the ECC bits. Alternately, wider memory chips may be substituted to add width for the ECC bits.

In FIG. 7A, wider memory chips are substituted to allow room for the ECC bits. ECC memory module 600 uses wider DRAM chips 602 to allow room for the additional ECC bits that are stored with every data word. For example, rather than use eight x8 DRAMs, eight x9 DRAMs are substituted. This increases the data width from 64 bits to 72 bits. The 72 bits allow for 8 ECC bits with 64 data bits.

The standard AMB is replaced by error-correcting AMB 100, which includes the ECC controller. The configuration for the ECC controller in error-correcting AMB 100 is read from SPD-EEPROM 130 at initialization.

In FIG. 7B, an additional memory chip is provided to allow room for the ECC bits. ECC memory module 630 uses additional DRAM chip 636 for storing the ECC bits for the data word stored in standard DRAM chips 632. When there are eight x8 DRAM chips 632, one additional DRAM chip 636 provides 8 ECC bits for each 64-bit data word. Two additional DRAM chips 636 could provide 16 ECC bits for each 64-bit data word.

Figure 8:
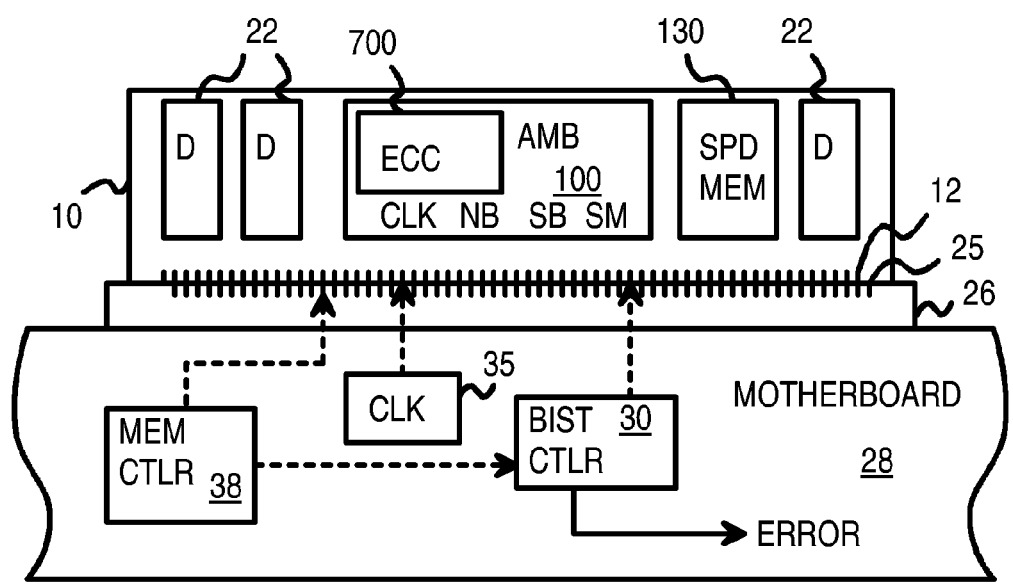
FIG. 8 shows a fully-buffered memory module with an error-correcting AMB driven by a memory controller on a motherboard.

FIG. 8 shows a fully-buffered memory module with an error-correcting AMB driven by a memory controller on a motherboard. Memory module 10 is inserted into memory module socket 26, with module contact pads 12 making contact with socket pads 25 in memory module socket 26 on PC motherboard 28.

With memory module 10 inserted into memory module socket 26, memory controller 38 on PC motherboard 28 receives data from a CPU or bus master and generates control signals that pass through memory module socket 26 to memory module 10. Clock generator 35 generates a clock that is also passed through as a clock to error-correcting AMB 100 on memory module 10.

The error-correction configuration is stored in SPD-EEPROM 130 during manufacture of the memory module. During initialization, the error correction configuration is copied from SPD-EEPROM 130 to error-correction configuration registers 68 in error-correcting AMB 100 so that ECC controller 700 can be configured.

Memory controller 38 on motherboard 28 does not have to support error correction. Indeed, memory controller 38 is not aware of error correction by ECC controller 700, since error correction is transparent to motherboard 28.

BIST controller 30 on motherboard 28 activates test modes of error-correcting AMB 100 using the SM bus. Errors detected by the internal BIST circuitry in error-correcting AMB 100 can be passed through to BIST controller 30 to signal an error to an operating system or boot routine running on motherboard 28. Errors that are not correctable by ECC controller 700 can also be passed through to BIST controller 30 to signal an error to an operating system or boot routine running on motherboard 28. BIST controller 30 can read the internal BIST registers of error-correcting AMB 100 to determine the type of errors.

Figure 9:
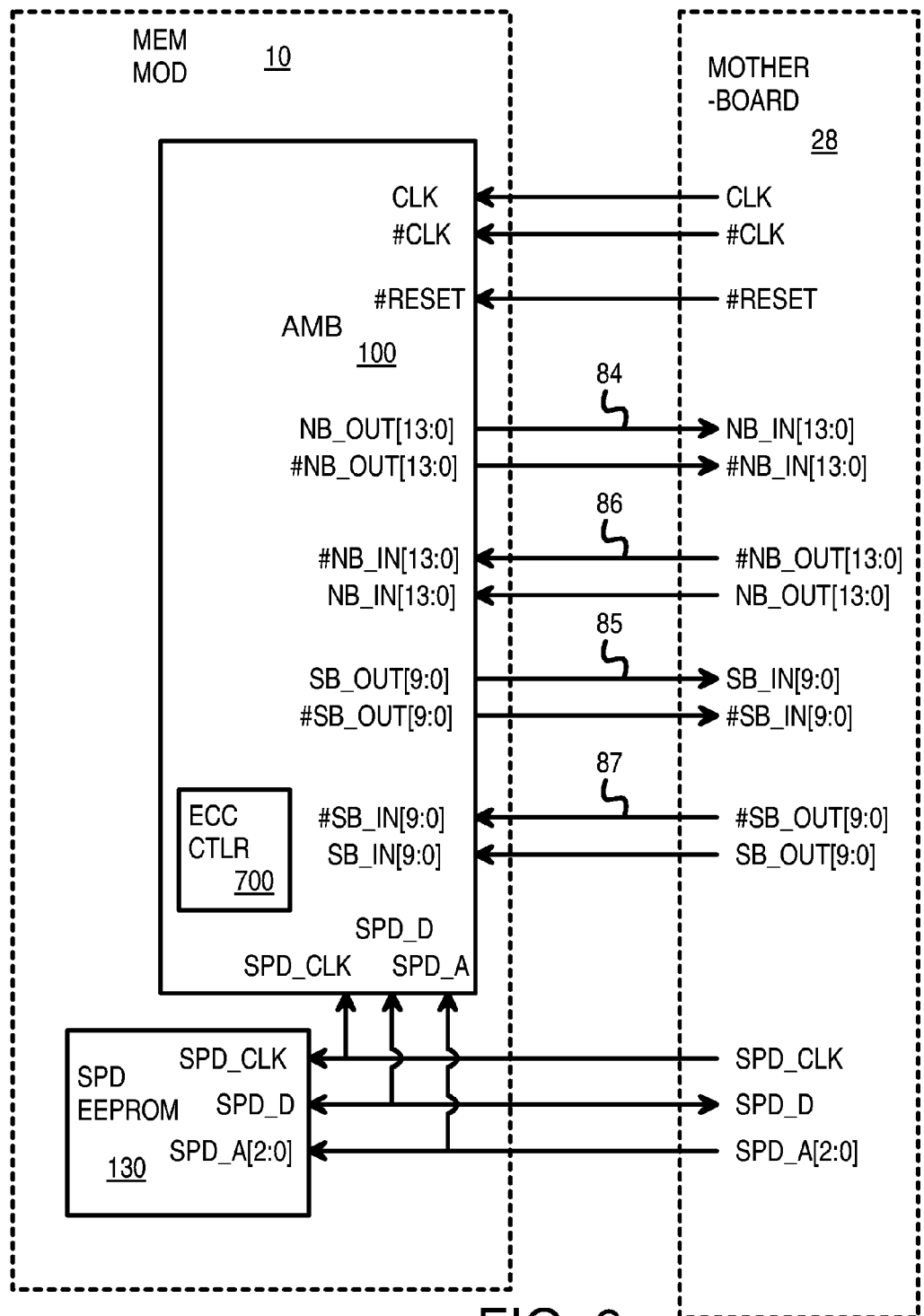
FIG. 9 is a diagram showing northbound and southbound lanes and SM bus signals between a memory module and a motherboard.

FIG. 9 is a diagram showing northbound and southbound lanes and SM bus signals between a memory module and a motherboard. Memory module 10 is a fully-buffered memory module that contains DRAM chips (not shown) that are buffered by error-correcting AMB 100. Motherboard 28 contains a processor and other logic that generates control signals such as a differential clock, a reset signal, a system management bus or other control signals applied to SPD-EEPROM 130. Motherboard 28 also contains a memory controller that generates serial packets that are sent to error-correcting AMB 100 on the memory module.

SPD EEPROM 130 stores configuration information about memory module 10 that is sent over serial data line SPD_D synchronized to SPD clock SPD_CLK. The configuration information includes error-correction-controller configuration information that configures ECC controller 700 in error-correcting AMB 100.

Address inputs to SPD EEPROM 130 are carried from motherboard 28 on address lines SPD_A[2:0], which may be hard wired on motherboard 28. The wiring configuration of SPD_A[2:0] on motherboard 28 determines the device address (memory-module slot number) of memory module 10. Data sent over serial data line SPD_D is a series of frames consisting of device address, device type (error-correcting AMB 100 or SPD EEPROM 130), register location, and register data. Test mode is activated on error-correcting AMB 100 by writing to the AMB test-mode control registers. Error-correcting AMB 100 and SPD EEPROM 130 can share clock, address, and serial data lines, but respond to different device types at the same device address.

Error correction configuration stored in SPD-EEPROM 130 can be copied to error correction configuration registers in error-correcting AMB 100 as serial data sent over serial data line SPD_D synchronized to serial clock SPD_CLK. SM-bus interface 134 in error-correcting AMB 100 can drive the device address of SPD-EEPROM 130 onto serial address lines SPD_A[2:0] to read SPD-EEPROM 130 over serial data lines SPD_D. SM-bus interface 134 on error-correcting AMB 100 could generate the serial clock, or a free-running serial clock generated on motherboard 28 could be used.

Northbound lane inputs NB_IN[13:0], #NB$_{13}$ IN[13:0] to error-correcting AMB 100 are connected to northbound lane motherboard outputs 86, NB_OUT[13:0], #NB_OUT[13:0] on motherboard 28. These 14 northbound lanes carry frames generated by downstream memory modules that are being sent to the processor, perhaps through upstream memory modules (not shown).

Northbound lane outputs NB_OUT[13:0], #NB_OUT[13:0] from error-correcting AMB 100 are connected to northbound lane motherboard inputs 84 (NB_IN[13:0], #NB_IN[13:0]) on motherboard 28. These 14 northbound lanes carry frames generated by memory module 10 or generated by downstream memory modules that are being sent to the processor. Northbound lane inputs NB_IN[13:0], #NB_IN[13:0] on motherboard 28 could connect to the memory controller and to the processor directly, or could connect to an upstream memory module (not shown).

Southbound lane inputs SB_IN[9:0], #SB_IN[9:0] to error-correcting AMB 100 are connected to southbound lane motherboard outputs 87, SB_OUT[9:0], #SB_OUT[9:0] on motherboard 28. These 10 southbound lanes carry frames generated by the processor that are being sent to memory module 10 or to downstream memory modules in the daisy chain.

Southbound lane outputs SB_OUT[9:0], #SB_OUT[9:0] from error-correcting AMB 100 are connected to southbound lane motherboard inputs 85 (SB_IN[9:0], #SB_IN[9:0]) on motherboard 28. These 10 southbound lanes carry frames generated by the processor that are being sent to downstream memory modules. Southbound lane outputs SB_OUT[9:0], #SB_OUT[9:0] on motherboard 28 could be driven by the memory controller directly, or could connect to an upstream memory module (not shown).

Alternate Embodiments

Several other embodiments are contemplated by the inventors. For example the various functions may be partitioned into a variety of kinds and numbers of blocks. Functions may be implements in hardware, software, firmware, or various combinations. For example, basic functions such syndrome generation and ECC bit generation may be implemented in hardware logic gates, while more complex functions such as error handling and correction may be assisted by execution of program instructions.

SPD-EEPROM 130 could be integrated into error-correcting AMB 100. ECC controller 700 could be external to error-correcting AMB 100 rather than be integrated with error-correcting AMB 100. Error-correction configuration registers 68 could be non-volatile memory on error-correcting AMB 100 and could be directly programmed once, eliminating the need to transfer the error-correction configuration from SPD-EEPROM 130 at each initialization. Error-correction configuration registers 68 could be an extension of an internal memory, or could be part of a larger on-chip memory that includes FIFO 58.

Memory for error-correction configuration registers 68 may be flip-flops, registers, latches, SRAM, DRAM, non-volatile memory, or other kinds of memory. Likewise, memory for storing ECC bits may be flip-flops, registers, latches, SRAM, DRAM, non-volatile memory, or other kinds of memory. The error-correction configuration registers and/or the memory for storing ECC bits may be internal or external to error-correcting AMB 100.

BIST controller 30 could be BIOS codes that are tightly linked to the operating system. It could also be an application program which is run during system maintenance. Other arrangements of blocks and functions within ECC controller 700 are possible. Many optimizations are possible.

The number of northbound and southbound lanes may vary. Different control signals may be used. Traces may be formed from metal traces on surfaces of the memory module, or on interior traces on interior layers of a multi-layer PCB. Vias, wire jumpers, or other connections may form part of the electrical path. Resistors, capacitors, or more complex filters and other components could be added. For example, power-to-ground bypass capacitors could be added to the memory module.

Signals may be half swing with source termination (output buffer) and load termination (input buffer). A series resistor or a shunt resistor in the path attenuates the signal. Shunt resistance may be around 500 ohms with a line impedance of 50 ohms.

Muxes and switches could be added to allow for loop-back testing as well as standard operation. Future memory module standards and extensions of the fully-buffered DIMM standard could benefit from the invention.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An error-correcting fully-buffered memory module comprising:
    a substrate having wiring traces formed thereon for conducting signals;

contact pads along a lower edge of the substrate, the contact pads for mating with a memory module socket on a motherboard;

a buffer chip mounted to the substrate;

a packet interface, in the buffer chip, for receiving incoming serial packets from the motherboard through the contact pads, and for generating outgoing serial packets for transmission through the contact pads to the motherboard;

memory chips mounted to the substrate, the memory chips having address, data, and control inputs that are isolated from the contact pads by the buffer chip;

a memory controller, in the buffer chip, for generating address, data, and control signals to the memory chips in response to the incoming serial packets received from the motherboard, and for reading read-data and error-correction code (ECC) bits from the memory chips in response to a read command extracted from the incoming serial packets; and an error-correction controller, coupled to the memory controller, for generating the ECC bits from write-data extracted from incoming serial packets by the packet interface, and for checking the ECC bits read from the memory chips by the memory controller;

wherein the memory chips store the ECC bits generated by the error-correction controller and the write-data extracted by the packet interface, whereby the ECC bits are locally generated by the error-correction controller and locally checked on the error-correcting fully-buffered memory module.

2. The error-correcting fully-buffered memory module of claim 1 wherein the error-correction controller further comprises an error corrector, activated when the error-correction controller detects an error in the read-data, for generating corrected read-data from the ECC bits and the read-data, whereby read-data is corrected by the error corrector.

3. The error-correcting fully-buffered memory module of claim 2 further comprising:

error-correction configuration registers for storing an error-correction configuration of the error-correction controller.

4. The error-correcting fully-buffered memory module of claim 3 wherein the error-correction configuration stored in the error-correction configuration registers comprises a number of ECC bits generated from the write-data.

5. The error-correcting fully-buffered memory module of claim 3 wherein the error-correction configuration stored in the error-correction configuration registers comprises an enable indicator that disables the error-correction controller.

6. The error-correcting fully-buffered memory module of claim 3 further comprising:

a serial-presence-detect electrically-erasable programmable read-only memory (SPD-EEPROM), mounted to the substrate and connected to the contact pads, the SPD-EEPROM for storing the error-correction configuration.

7. The error-correcting fully-buffered memory module of claim 6 wherein the SPD-EEPROM is also for storing a configuration of the memory chips mounted on the substrate.

8. The error-correcting fully-buffered memory module of claim 6 wherein the error-correction configuration is stored in the SPD-EEPROM and in the error-correction configuration registers, the error-correction configuration remaining in the SPD-EEPROM when power is removed, the error-correction configuration being lost from the error-correction configuration registers when power is removed.

9. The error-correcting fully-buffered memory module of claim 3 wherein the contact pads carry module signals that comprise:

a differential clock and a reset signal that are applied to the buffer chip.

10. The error-correcting fully-buffered memory module of claim 9 wherein the module signals further comprise serial-presence-detect signals that comprise:

a serial-presence-detect clock;

a serial-presence-detect device address; and serial-presence-detect data;

wherein the serial-presence-detect signals are applied to the buffer chip and to the SPD-EEPROM.

11. The error-correcting fully-buffered memory module of claim 3 wherein the buffer chip is an Advanced Memory Buffer (AMB) and wherein the contact pads comprise:

northbound-lane module inputs for connecting to northbound-lane inputs of the buffer chip, the northbound-lane module inputs being differential inputs for carrying data buffered from memory chips of downstream memory modules inserted into other memory module sockets on the motherboard;

northbound-lane module outputs for connecting to northbound-lane outputs of the buffer chip, the northbound-lane module outputs being differential outputs for carrying data buffered from the memory chips to a processor on the motherboard;

southbound-lane module inputs for connecting to southbound-lane inputs of the buffer chip, the southbound-lane module inputs being differential inputs for carrying data from the processor on the motherboard to the memory chips or to memory chips of downstream memory modules; and southbound-lane module outputs for connecting to southbound-lane outputs of the buffer chip, the southbound-lane module outputs being differential outputs for carrying data from the processor to memory chips of downstream memory modules, whereby the contact pads of the error-correcting fully-buffered memory module include northbound lanes and southbound lanes.

12. The error-correcting fully-buffered memory module of claim 11 wherein the error-correction configuration registers and the error-correction controller are integrated into the buffer chip with the packet interface and the memory controller.

13. The error-correcting fully-buffered memory module of claim 12 wherein the error-correction configuration registers comprise a non-volatile memory.

14. The error-correcting fully-buffered memory module of claim 3 wherein the memory chips comprise ECC memory chips that store the ECC bits and data memory chips that store the write-data extracted by the packet interface and generate the read-data in response to the memory controller, whereby the ECC bits are stored in separate memory chips from the write-data.

15. An error-correcting advanced memory buffer comprising:

southbound input means for receiving packets over southbound serial lanes from a host processor;

southbound output means for transmitting packets over southbound serial lanes to a downstream memory module;

southbound re-timer means, coupled between the southbound input means and the southbound output means, for re-timing packets received by the southbound input means for transmission over the southbound output means;

northbound input means for receiving packets over northbound serial lanes from the downstream memory module;

northbound output means for transmitting packets over northbound serial lanes toward the host processor;

northbound re-timer means, coupled between the northbound input means and the northbound output means, for re-timing packets received by the northbound input means for transmission over the northbound output means;

memory controller means for generating local control signals to memory chips on a local memory module containing the error-correcting advanced memory buffer;

packet extract means, coupled between the southbound re-timer means and the memory controller means, for extracting commands, address and data from packets received over the southbound input means from the host processor;

packet generation means, coupled between the northbound re-timer means and the memory controller means, for generating packets for transmission over the northbound output means to the host processor;

wherein the packets generated by the packet generation means contain data read from the memory chips by the memory controller means;

error-correction configuration registers means for storing an error-correction configuration; and error-correction controller means, coupled to the error-correction configuration registers means and to the memory controller means, for generating and checking error-correction code (ECC) bits, the error-correction controller means sending the ECC bits to the memory controller means, the error-correction controller means receiving the ECC bits from the memory controller means;

wherein the memory controller means is further for writing data and the ECC bits to the memory chips, and is further for reading data and the ECC bits from the memory chips;

whereby the ECC bits are locally generated, written, read, and checked by the error-correcting advanced memory buffer.

16. The error-correcting advanced memory buffer of claim 15 further comprising:

ECC generation means for generating the ECC bits from data extracted from packets by the packet extract means and written to the memory chips by the memory controller means; and ECC checking means for checking the ECC bits and data read from the memory chips by the memory controller means.

17. The error-correcting advanced memory buffer of claim 16 further comprising:

ECC correcting means for correcting data read from the memory chips by the memory controller means when the ECC checking means detects a correctable error, the ECC correcting means generating replacement data.

18. The error-correcting advanced memory buffer of claim 17 wherein the packets generated by the packet generation means contain the replacement data generated by the ECC correcting means when the ECC checking means detects the correctable error.

19. The error-correcting advanced memory buffer of claim 18 further comprising:

multiplexer means for sending the replacement data to the packet generation means when the ECC checking means detects the correctable error, and for sending the data read by the memory controller means to the packet generation means when the ECC checking means does not detect the correctable error.

20. The error-correcting advanced memory buffer of claim 17 further comprising:

management-bus interface means for reading the error-correction configuration from a non-volatile memory over a management bus and for writing the error-correction configuration to the error-correction configuration registers means, whereby the error-correction configuration is copied from the non-volatile memory to the error-correction configuration registers means.

21. The error-correcting advanced memory buffer of claim 16 further comprising:

syndrome generation means, receiving the ECC bits and the data read from the memory chips by the memory controller means, for generating an error correction syndrome that indicates an error when the error correction syndrome has a non-zero value.

22. The error-correcting advanced memory buffer of claim 15 wherein the error-correction configuration identifies a number of ECC bits stored within the memory chips for each data word.

* * * * *